US008842034B1

(12) United States Patent
Gong

(10) Patent No.: US 8,842,034 B1
(45) Date of Patent: Sep. 23, 2014

(54) RESISTOR NETWORK IMPLEMENTED IN AN INTEGRATED CIRCUIT

(71) Applicant: Xilinx, Inc., San Jose, CA (US)

(72) Inventor: Jingfeng Gong, Singapore (SG)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/760,468

(22) Filed: Feb. 6, 2013

(51) Int. Cl.
*H03M 1/78* (2006.01)
*H01L 23/522* (2006.01)

(52) U.S. Cl.
CPC .................... *H01L 23/5228* (2013.01)
USPC .......................... 341/154; 341/144

(58) Field of Classification Search
CPC ........................................ H03M 1/78
USPC ......................... 341/144, 154, 155
See application file for complete search history.

(56) References Cited

U.S. PATENT DOCUMENTS

| 6,100,153 | A | 8/2000 | Nowak et al. | |
|---|---|---|---|---|
| 7,256,721 | B2* | 8/2007 | Copley | 341/144 |
| 7,259,706 | B2* | 8/2007 | Haurie et al. | 341/154 |
| 7,639,166 | B2* | 12/2009 | Iijima | 341/145 |
| 7,733,257 | B1* | 6/2010 | Lee | 341/144 |
| 7,773,019 | B2* | 8/2010 | Soude et al. | 341/154 |
| 8,031,100 | B2* | 10/2011 | Motamed | 341/154 |

* cited by examiner

*Primary Examiner* — Jean B Jeanglaude
(74) *Attorney, Agent, or Firm* — John J. King

(57) ABSTRACT

A resistor network implemented in an integrated circuit includes a first plurality of interconnect traces coupled in series at a first plurality of nodes; a first plurality of switches coupled between the first plurality of nodes and an output node; a second plurality of interconnect traces coupled in series at a second plurality of nodes; and a second plurality of switches coupled between the second plurality of nodes and the output node, wherein a voltage at the output node is generated in response to a resistance of the resistor network based upon a configuration of the first plurality of switches and the second plurality of switches.

20 Claims, 6 Drawing Sheets

US 8,842,034 B1

RESISTOR NETWORK IMPLEMENTED IN AN INTEGRATED CIRCUIT

TECHNICAL FIELD

The present invention relates generally to integrated circuits, and in particular, to a resistor network implemented in an integrated circuit.

BACKGROUND

As integrated circuits continue to shrink in size, the shrinking of elements of the integrated circuits can have different impacts on different circuits of the integrated circuit. Examples of elements of integrated circuits which have been reduced in size are transistors and interconnect traces. However, resistors are one element which have not been reduced in size as fast as other elements of integrated circuits. Resistors may often be used in a resistor network, which may have applications in particular circuits such as in a digital-to-analog converter (DAC) circuit. DAC circuits are used extensively in serial-deserializer (Serdes) transceivers, for example, to implement an adaptation algorithm for cancelling the non-ideal effects during data transmission by translating digital inputs into a corresponding analog signal level.

Depending on the specific applications and products, a DAC circuit is designed to meet a number of specifications including resolution, speed, linearity, and power. Different DAC circuit topologies are used in conventional circuits. For example, current steering and resistor ladder DAC circuits are the two common types of DAC circuits. Current steering DAC circuits generally have higher speed when driving capacitive loads, but consume a significant amount of power. In contrast, resistive DAC circuits usually burn less power, but have a larger output impedance which is a drawback for high speed operation. Accordingly, there is a need for improved DAC circuits.

SUMMARY

A resistor network implemented in an integrated circuit is described. The resistor network comprises a first plurality of interconnect traces coupled in series at a first plurality of nodes; a first plurality of switches coupled between the first plurality of nodes and an output node; a second plurality of interconnect traces coupled in series at a second plurality of nodes; and a second plurality of switches coupled between the second plurality of nodes and the output node. A voltage at the output node is generated in response to a resistance of the resistor network based upon a configuration of the first plurality of switches and the second plurality of switches.

According to another arrangement, a resistor network implemented in an integrated circuit comprises a first plurality of interconnect traces coupled in series at a first plurality of nodes; a first resistor coupled to the first plurality of interconnect traces; a first plurality of switches coupled between the first plurality of nodes and an output node; a second plurality of interconnect traces coupled in series at a second plurality of nodes; and a second plurality of switches coupled between the second plurality of nodes and the output node. A voltage at the output node is generated in response to a resistance of the resistor network based upon a configuration of the first plurality of switches and the second plurality of switches.

A method of implementing a resistor network is also described. The method comprises coupling a first plurality of interconnect traces in series at a first plurality of nodes; coupling a first plurality of switches between the first plurality of nodes and an output node; coupling a second plurality of interconnect traces in series at a second plurality of nodes; coupling a second plurality of switches between the second plurality of nodes and the output node; and generating a voltage at the output node in response to a resistance of the resistor network based upon a configuration of the first plurality of switches and the second plurality of switches.

DETAILED DESCRIPTION

Figure 1:
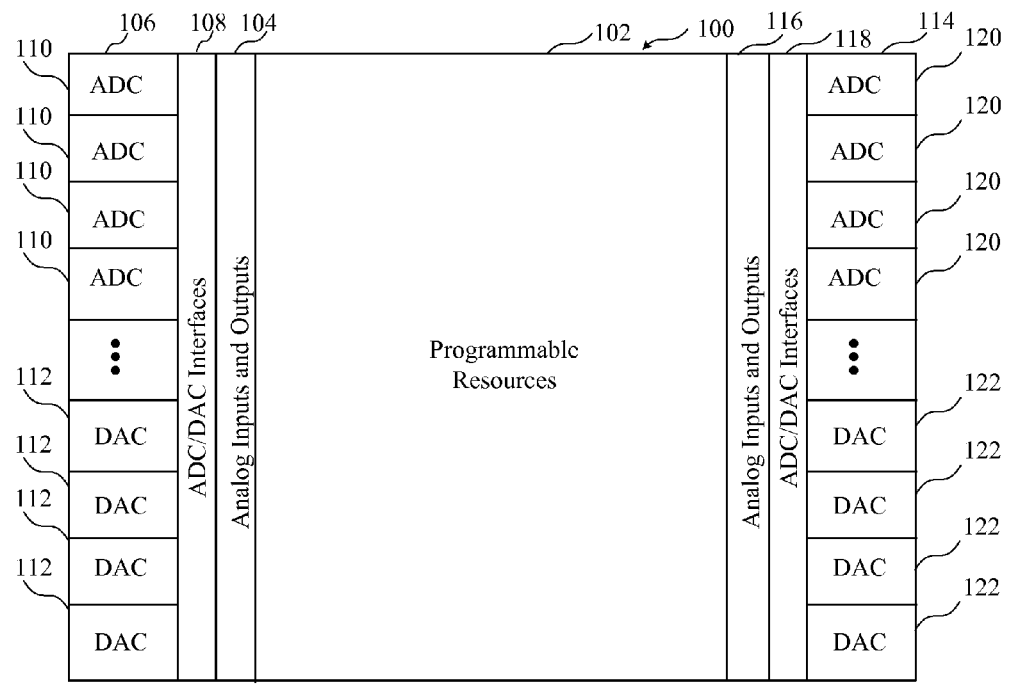
FIG. 1 is a block diagram of an integrated circuit having analog-to-digital converter (ADC) circuits and DAC circuits.
Figure 11:
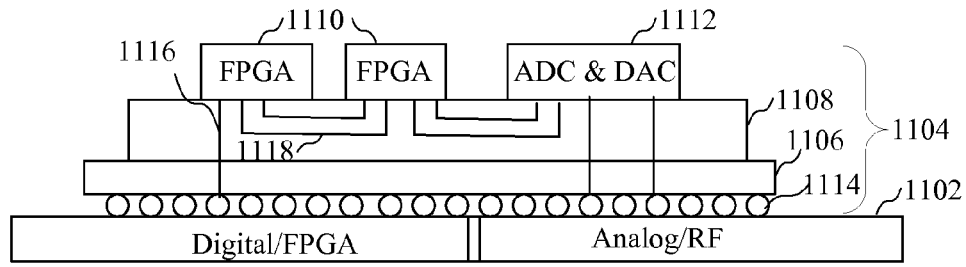
FIG. 11 is a block diagram of an integrated circuit having a DAC circuit.

Turning first to FIG. 1, a block diagram of an integrated circuit having ADC circuits and DAC circuits is shown. The integrated circuit 100 comprises programmable resources 102 and a column of analog inputs and outputs 104 which enables access to a column 106 of ADC circuits 110 and DAC circuits 112 by way of ADC/DAC interfaces 108. A second column of analog inputs and outputs 116 enables access to a column 114 of ADC circuits 120 and DAC circuits 122 by way of ADC/DAC interfaces 118. As is described in more detail below, the elements of FIG. 1 may be provided on a single die, or multiple die of a single integrated circuit as shown in FIG. 11. An ADC circuit converts an analog input, such as voltage or current, to a digital number which is proportional to the magnitude of the analog input signal, while a DAC circuit converts a digital value to an analog value which is proportional to the digital value. The resolution of a DAC circuit indicates the number of discrete values which can be received to generate corresponding analog values. For example, a twelve bit DAC circuit can receive one of $2^{12}$ or 4096 levels to encode an analog input.

Figure 2:
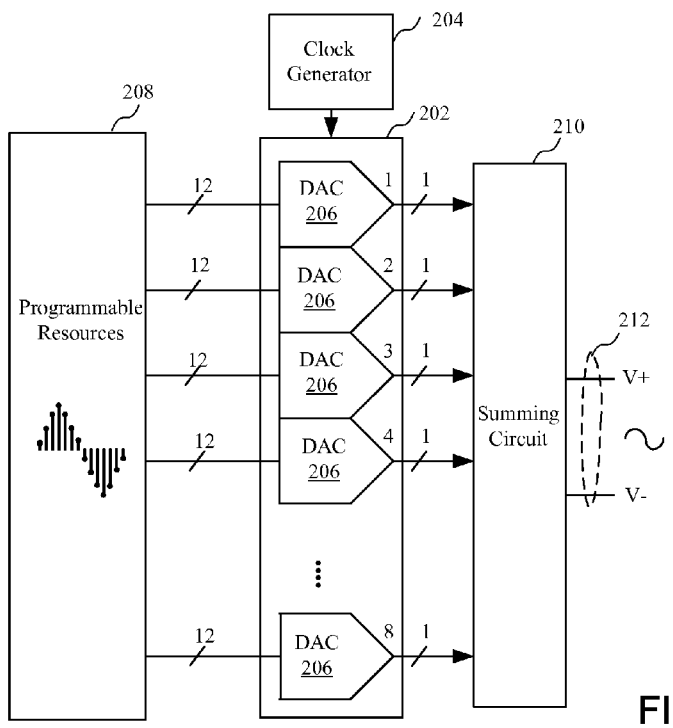
FIG. 2 is a block diagram of a portion of the integrated circuit of FIG. 1 showing the implementation of a DAC circuit.

Turning now to FIG. 2, a block diagram of a portion of the integrated circuit of FIG. 1 shows the implementation of a DAC circuit. In particular, a block 202 coupled to a clock generator 204 comprises a plurality of DAC circuits 206. The DAC circuits 206 are coupled to receive inputs from programmable resources 208 or other circuits of the integrated circuit. A summing circuit 210 is also coupled to receive the outputs of the DAC circuits and generate an analog output signal 212. Depending upon the implementation of the DAC circuits, the summing circuit 210 enables the summing of outputs of different DAC circuits.

The DAC circuits 206 are an important block in many functional blocks such as Serdes Transceivers inside a programmable logic device, which is described in more detail below in reference to FIGS. 8-10. Implementing a high speed and low power DAC circuits is a considerable design challenge. The DAC circuits described in more detail in reference to FIGS. 3 and 4 below provide interconnect traces of routing metal layers as resistive elements. Implementing the interconnection traces as resistive elements makes it feasible to have low resistance value DAC elements, while also having a reasonably small layout size. Providing a small layout is usually difficult to achieve for an advanced CMOS technology in which the high sheet resistance (high-R) resistors are the only resistor device options without too much undesired parasitics which are found in diffusion resistors.

Power consumption is an important consideration for circuit design, and therefore a resistive DAC circuit provides a reasonable circuit structure option. An intermeshed resistor ladder reduces the effective number of resistors between low and high reference voltages, and the resolution is maintained by dividing the each coarse resistor voltage into multiple segments by fine ladder resistors. While an intermeshed resistor ladder works well provided the resistor element value and number of effective bits are small, a large number of unit resistors are still required for high resolution DAC circuit. Further, the resistor options available for analog circuit design are quite limited in advanced CMOS technologies. In many cases, the high-R resistors are usually the only resistors available for analog/mixed signal circuits including DAC circuits because of concerns over manufacturing yield and broad resistance range requirement. Because the high-R resistors will limit the operation speed of the resistive DAC circuit, multiple resistors can be placed in parallel to reduce the resistance, increasing the layout size dramatically. However, an intermeshed resistor ladder consisting of interconnect traces implemented as resistors is implemented as shown in FIGS. 3 and 4 to address the speed or settling time issue with a resistive DAC circuit.

Figure 3:
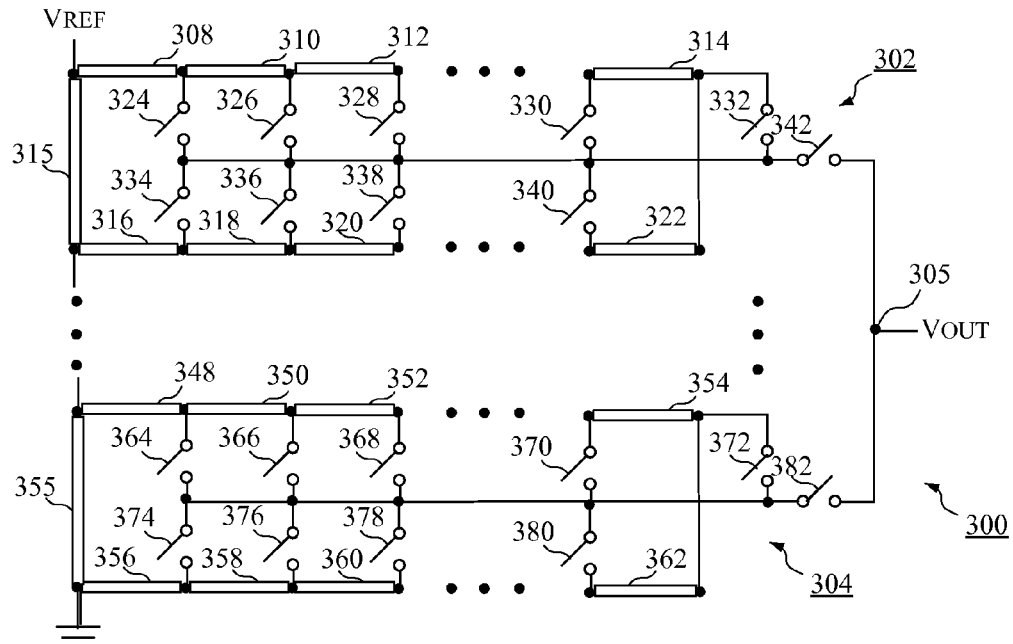
FIG. 3 is a block diagram of a resistor network, comprising interconnect traces, which is associated with a DAC circuit in an integrated circuit.
Figure 4:
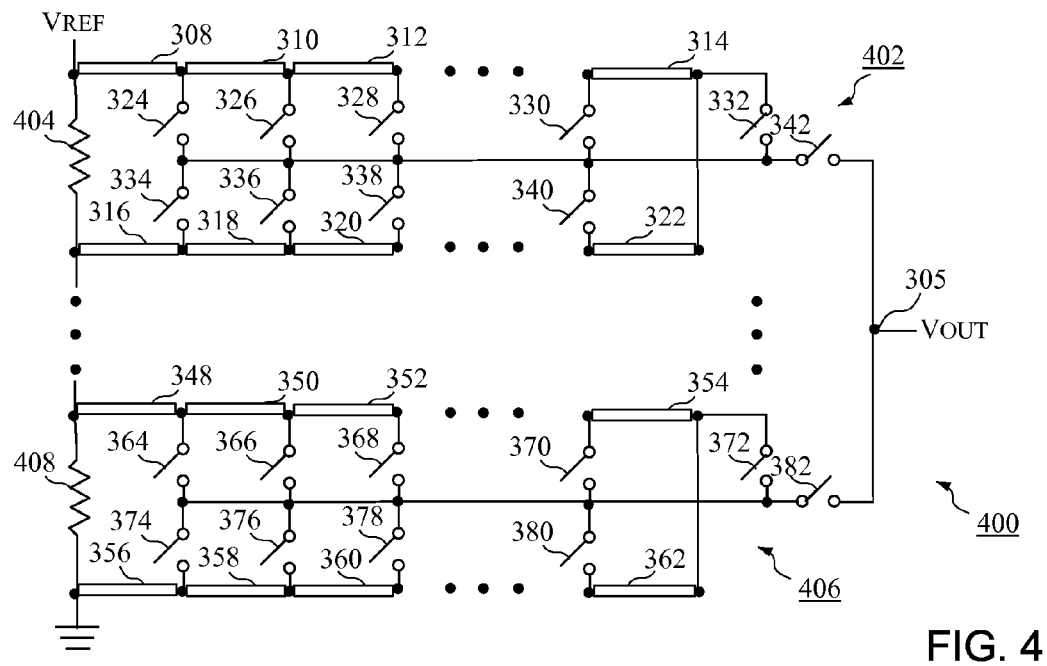
FIG. 4 is a block diagram of a resistor network, comprising a combination of interconnect traces and a resistor, that is associated with a DAC circuit in an integrated circuit.

As shown in the block diagram of a resistor network of FIG. 3, interconnect traces are used to implement a resistor network of a DAC circuit in an integrated circuit. More particularly, a resistor network 300 (which may be implemented as a DAC circuit) comprises a plurality of parallel resistors networks 302 and 304 having interconnect traces coupled by switches to provide an appropriate resistance between a reference voltage (Vref) and an output node 305 to generate an appropriate output voltage (Vout). Various switches for selecting the resistors in the network may be opened or closed to provide the correct combination of series and parallel resistive elements to create a desired resistance between the reference voltage and the output node 305.

The parallel resistor network 302 comprises a first group of resistors 308-314 connected in series at a first plurality of nodes to the reference voltage Vref, and a second group of resistors 315-322 coupled in series at the second plurality of nodes and to the reference voltage Vref. Switches 324-332, which may comprise transistor switches for example, enable a predetermined number of resistor elements 308-314 to be coupled in series between the reference voltage Vref and the output node 305. A number of a second group of resistor elements may also be selected to be coupled in series between the reference voltage Vref and the output node 305 by switches 334-340. As shown in FIG. 3, the selected resistors of the first group of resistors are coupled in parallel with the selected resistors of the second group of resistors. A switch 342 may be selected to determine whether the selected resistors of the first group of resistors 308-314 (which are coupled in series) and the selected resistors of the second group of resistors 315-322 (which are coupled in series with one another and coupled in parallel with the selected transistors of the first group of transistors 308-314) are coupled in parallel with selected transistors of the second parallel resistor network 304 (or some other parallel resistor network). That is, while two groups of series resistors 308-314 and 315-322 are shown as a part of the parallel resistor network 302, it should be understood that a greater number of groups of series resistors may be employed in the parallel resistor network 302.

The second parallel resistor network 304 comprises a first group of resistors 348-354 connected in series between Vref and the output node 305 and a second group of resistors 355-362. Switches 364-372 enable a predetermined number of resistor elements 348-354 to be coupled in series between the reference voltage and the output node 305. A number of a second group of resistors 355-362 may be selected to be coupled in series by switches 374-380. A switch 382 may be selected to determine whether the selected transistors of the first group of transistors 348-354 (which are coupled in series) and the selected transistors of the second group of transistors 355-362 (which are coupled in series with one another and coupled in parallel with the selected transistors of the first group of transistors 348-354) are coupled in parallel with selected transistors of the first parallel resistor network 302.

Each of the resistor elements 308-314, 315-322, 348-354, and 355-362 is an interconnect trace in the arrangement of FIG. 3. The interconnect traces may be formed using aluminum, copper or some other suitable material in an integrated circuit, and may have different thicknesses or dimensions to select a desired resistance for the resistor network. All interconnect traces representing resistor elements may have the same dimensions and therefore the same resistance values, or different interconnect traces may have different resistance values. For example, resistor elements formed by interconnect traces may have different lengths, widths, or thicknesses.

As shown in FIG. 4, a resistor network comprises a combination of resistors implemented as interconnect traces along with resistors, such as polysilicon resistors in a DAC circuit of an integrated circuit. More particularly, the interconnect trace resistor 315 of FIG. 3 is replaced in the parallel resistor network 402 by a higher impedance resistor 404 which is formed as a conventional resistor, such as a polysilicon resistor or a TiN resistor, or some other resistor material other than the metal of the interconnect traces, as implemented for the remaining resistors. Interconnect trace resistor 355 in parallel resistor network 406 is replaced with resistor 408, which is also formed as a conventional resistor, such as a polysilicon resistor or a TiN resistor, or some other resistor material other than the interconnect trace. The current through a resistor cannot be too small. The current through a resistor may be approximately 100 microamps (uA) for a coarse resistor and approximately 20 uA for a fine resistor, for example. The resistance of a coarse resistor may be approximately 40 ohms, and the resistance of a fine resistor may be approximately 25 ohms, for example. According to the arrangement of FIG. 4, there may be 8 fine resistors (e.g., interconnect trace resistors) for each coarse resistor (e.g., a conventional polysilicon resistor). While the specific arrangement of resistors formed by interconnect traces and conventional resistors is shown, it should be understood that other arrangements of conventional resistors and interconnect trace resistors may be employed. The partition between coarse resistors and fine resistors provides a trade-off between speed and linearity, such as integral non-linearity (INL). Because INL is mainly set by the high-R resistor, implementing resistors as shown in the resistor networks of the circuits of FIG. 3 or 4 will significantly reduce INL.

The circuits of FIGS. 3 and 4 provide a fast speed DAC circuit without increasing the layout size. Because the metal routing layers in advanced CMOS process have very fine feature sizes and have much smaller sheet resistance (which is required for today's process to minimize the interconnect RC delay), resistors in a resistive DAC circuit according to the circuits of FIGS. 3 and 4 have much smaller resistance without increasing (or even reducing) the layout size. Accordingly, a high resolution, fast speed, low power DAC having a small layout footprint DAC circuit is provided. That is, by using the metal layers having a low sheet resistance, a DAC having an overall reduced layout size and reduced parasitic capacitance can be achieved.

Figure 5:
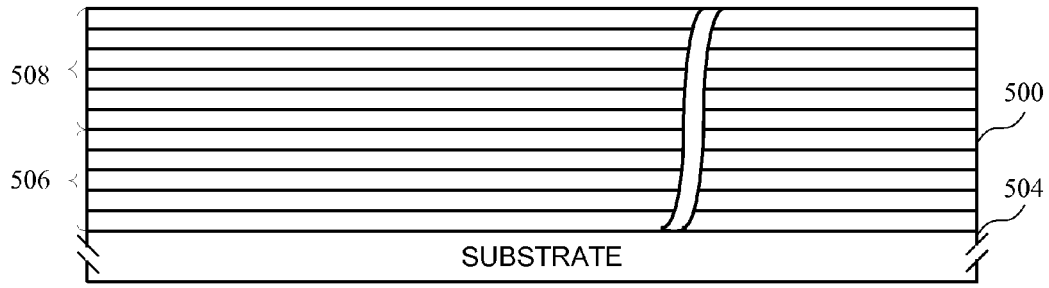
FIG. 5 is a cross-sectional view of an integrated circuit showing metal layers formed on substrate.

Turning now to FIG. 5, a cross-sectional view of an integrated circuit shows metal layers formed on a substrate. DAC circuits of an integrated circuit 500 comprise switch elements formed in a substrate 504, such as the circuit elements described in FIGS. 1-4, and a plurality of metal layers 506 and 508 which are separated by a dielectric layer (or other material) and couple the circuit elements formed in the substrate. For example, the first 5 layers 506 may comprise conductors used for connecting circuit elements of the various functional blocks, such as BRAM or CLBs of a programmable logic device (which is described in more detail in reference to FIG. 9), while the interconnect circuits (i.e., conductors for connecting the various functional blocks) may be positioned on the upper six layers 508. Even layers of the interconnect layers may be used to route signals in a longitudinal direction, while odd layers may be used to route signals in a lateral direction. As is described in more detail in reference to FIGS. 6 and 7, resistors, such as polysilicon resistors or interconnect trace resistors formed in the metal layers, may be formed in the substrate.

Figure 6:
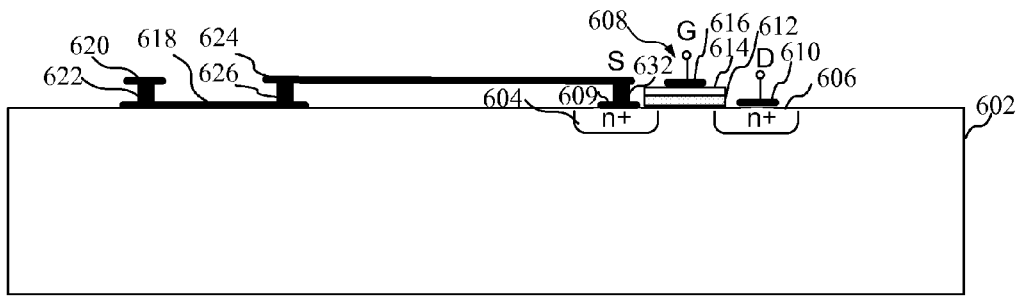
FIG. 6 is a cross-sectional view of an integrated circuit showing a resistor implemented as a metal trace and a corresponding transistor switch.

Turning now to FIG. 6, a cross-sectional view of an integrated circuit shows a resistor implemented as an interconnect trace of a metal layer and a corresponding transistor switch. In particular, a semiconductor substrate 602 comprises a source diffusion region 604 and a drain diffusion region 606 of a transistor 608, which may function as a switch of the circuits of FIGS. 3 and 4. Contacts 609 and 610 enable connections to the source diffusion region 604 and drain diffusion region 606, respectively. A gate of the transistor has a gate oxide layer 612 which is covered by a gate 614 and a gate contact 616. An interconnect trace 618 comprising a resistor, such as one of the resistors of the resistor networks of FIG. 3 or 4, extends from a contact 620 (coupled to the interconnect trace 618 by a via 622) to an interconnect trace 624 (coupled to the interconnect trace 618 by a via 626). The interconnect trace 618 may have a selected resistance based upon a certain length, width, or thickness of the metal layer. The interconnect trace 624 is coupled to a terminal of the transistor 608, such as by way of a via 632 coupled to the contact 609. While transistor 604 is an N-type transistor, transistor 604 may be implemented as a P-type transistor, or an N-type transistor in parallel with a P-type transistor implemented as a complementary metal oxide semiconductor (CMOS) pass gate.

Figure 7:
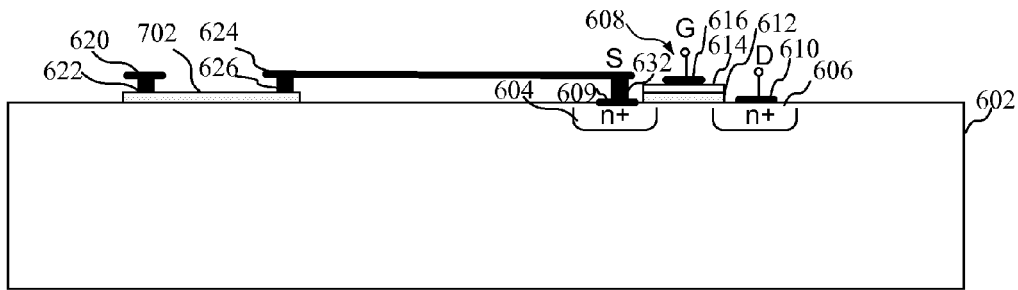
FIG. 7 is a cross-sectional view of an integrated circuit showing a high resistance (Hi-R) resistor and a corresponding transistor switch.

Turning now to FIG. 7, a cross-sectional view of an integrated circuit shows a high-R resistor and a corresponding transistor switch. In particular, a resistor 702, such as a polysilicon resistor formed by the application of a polysilicon layer on the surface of the substrate, can be implemented in place of the interconnect trace (functioning as a resistor) between the via 622 and the via 626. The material forming the resistor 702 may be any material other than the metal of a metal layer forming the interconnect trace resistor 618.

By implementing both conventional resistors, such as polysilicon resistors, and interconnect traces implemented as resistors, coarse and fine resistors may be selected to generate a desired resistance having a high resolution without increasing the size of the resistor network. A hi-R resistor may have a ratio of width-to-length of approximately ⅛ and a sheet resistance of approximately 495 ohms/sq, for example. To implement a 24 ohm resistor, 10 parallel high-R resistors may be implemented using a 600 ohm/sq material and with a minimum high-R resistor size of a length of 0.36 micrometers (um) and a width of 0.9 um, for example. In contrast, fine resistors implemented using metal layers having a thickness of approximately 700 Angstroms (A) (having a sheet resistance of approximately 0.87 ohm/sq), may have a length of approximately 2.5 um and a width of approximately 100 nm, for example. In a device implementing 14 DAC circuits with fine resistors implemented in metal layers as shown in FIGS. 3 and 4, the 14 DAC circuits may be implemented in an area that is approximately 1.5 times the area of a single conventional DAC circuit using polysilicon resistors, for example.

Figure 8:
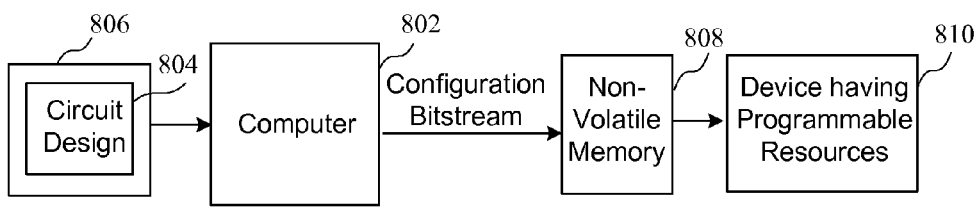
FIG. 8 is a block diagram of a system for programming a device having programmable resources.

Turning now to FIG. 8, a block diagram of a system for programming a device having programmable resources is shown. In particular, a computer 802 is coupled to receive a circuit design 804 from a memory 806, and generate a configuration bitstream which is stored in the non-volatile memory 806. As is described in more detail below, the circuit design may be a high level design, such as a circuit design defined in a hardware description language (HDL), to be implemented in a device 810 having programmable resources. Also, the computer may be configured to run software that generates a configuration bitstream which is stored in the non-volatile memory 806.

The software flow for a circuit design to be implemented in a programmable integrated circuit comprises synthesis, packing, placement and routing, as is well known in the art. Synthesis comprises the step of converting a circuit design in a high level design to a configuration of elements found in the programmable integrated circuit. For example, a synthesis tool operated by the computer 902 may implement the portions of a circuit design implementing certain functions in configurable logic blocks (CLBs) or digital signal processing (DSP) blocks, for example. An example of a synthesis tool is the ISE tool available from Xilinx, Inc. of San Jose Calif. Packing comprises the step of grouping portions of the circuit design into defined blocks of the device, such as CLBs. Placing comprises the step of determining the location of the blocks of the device defined during the packing step. Finally, routing comprises selecting paths of interconnect elements, such as programmable interconnects, in a programmable integrated circuit. At the end of place and route, all functions, positions and connections are known, and a configuration bitstream is then created. The bitstream may be created by a software module called BitGen, available from Xilinx, Inc. of San Jose, Calif. The bitstream is either downloaded by way of a cable or programmed into an EPROM for delivery to the programmable integrated circuit.

Figure 9:
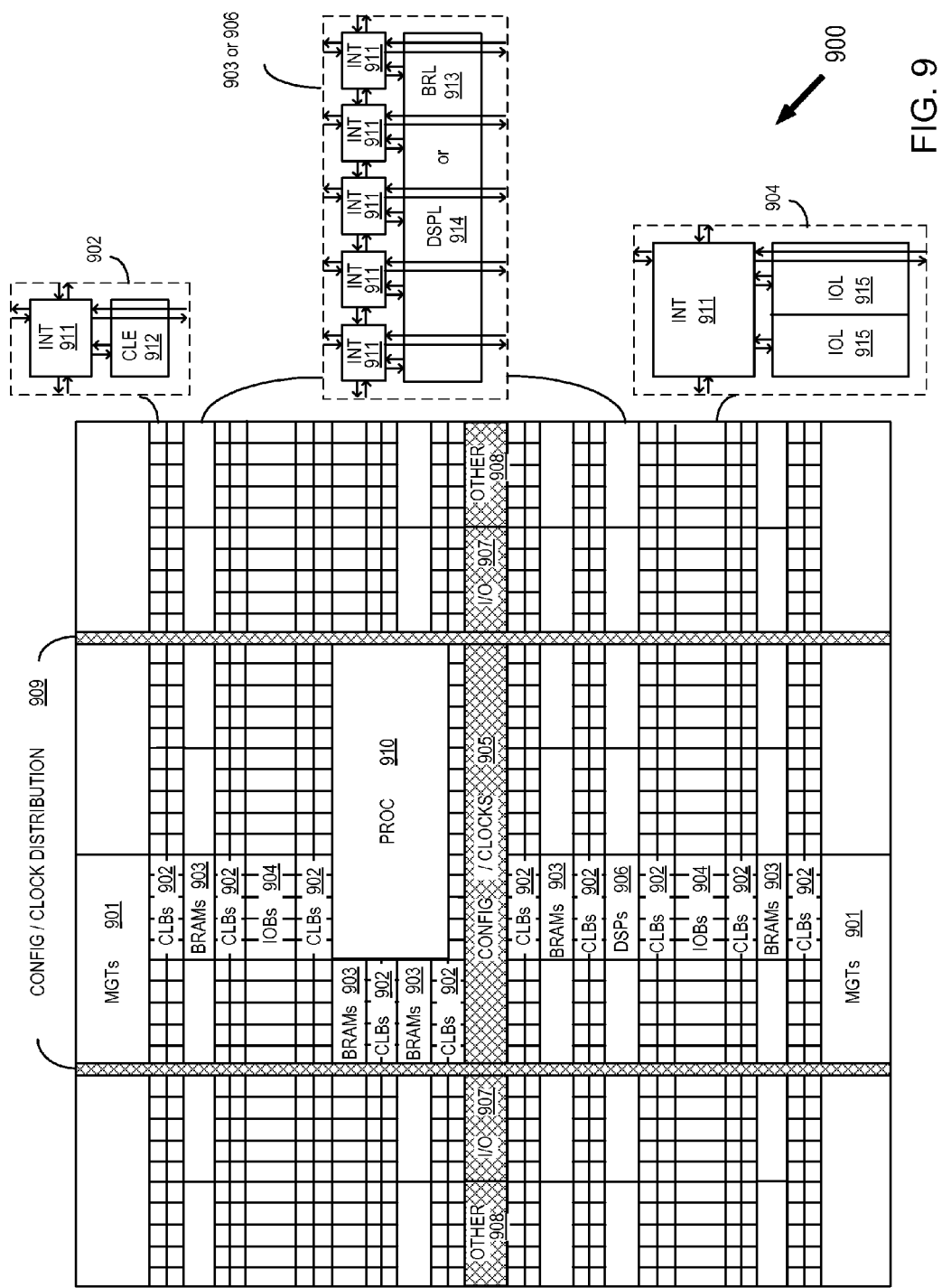
FIG. 9 is a block diagram of a device having programmable resources.

Turning now to FIG. 9, a block diagram of a programmable integrated circuit device having programmable resources according to an embodiment is shown. While devices having programmable resources may be implemented in any type of integrated circuit device, such as an application specific integrated circuit (ASIC) having programmable resources, other devices comprise dedicated programmable logic devices (PLDs). One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., Flash memory, as in some CPLDs), or in any other type of memory cell.

The device of FIG. 9 comprises an FPGA architecture 900 having a large number of different programmable tiles including multi-gigabit transceivers (MGTs) 901, CLBs 902, random access memory blocks (BRAMs) 903, input/output blocks (IOBs) 904, configuration and clocking logic (CONFIG/CLOCKS) 905, digital signal processing blocks (DSPs) 906, specialized input/output blocks (I/O) 907 (e.g., configuration ports and clock ports), and other programmable logic 908 such as digital clock managers, analog-to-digital converters, system monitoring logic, and so forth. Some FPGAs also include dedicated processor blocks (PROC) 910, which may be used to implement a software application, for example.

In some FPGAs, each programmable tile includes a programmable interconnect element (INT) 911 having standardized connections to and from a corresponding interconnect element in each adjacent tile. Therefore, the programmable interconnect elements taken together implement the programmable interconnect structure for the illustrated FPGA. The programmable interconnect element 911 also includes the connections to and from the programmable logic element within the same tile, as shown by the examples included at the top of FIG. 9.

For example, a CLB 902 may include a configurable logic element (CLE) 912 that may be programmed to implement user logic plus a single programmable interconnect element 911. A BRAM 903 may include a BRAM logic element (BRL) 913 in addition to one or more programmable interconnect elements. The BRAM includes dedicated memory separate from the distributed RAM of a configuration logic block. Typically, the number of interconnect elements included in a tile depends on the height of the tile. In the pictured embodiment, a BRAM tile has the same height as five CLBs, but other numbers may also be used. A DSP tile 906 may include a DSP logic element (DSPL) 914 in addition to an appropriate number of programmable interconnect elements. An 10B 904 may include, for example, two instances of an input/output logic element (IOL) 915 in addition to one instance of the programmable interconnect element 911. The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured embodiment, a columnar area near the center of the die is used for configuration, clock, and other control logic. Horizontal areas 909 extending from this column are used to distribute the clocks and configuration signals across the breadth of the FPGA. Some FPGAs utilizing the architecture illustrated in FIG. 9 include additional logic blocks that disrupt the regular columnar structure making up a large part of the FPGA. The additional logic blocks may be programmable blocks and/or dedicated logic. For example, the processor block PROC 910 shown in FIG. 9 spans several columns of CLBs and BRAMs.

Note that FIG. 9 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 9 are purely exemplary. For example, in an actual FPGA more than one adjacent column of CLBs is typically included wherever the CLBs appear in order to facilitate the efficient implementation of user logic. While the embodiment of FIG. 9 relates to an integrated circuit having programmable resources, it should be understood that the circuits and methods set forth in more detail below may be implemented in any type of ASIC.

Figure 10:
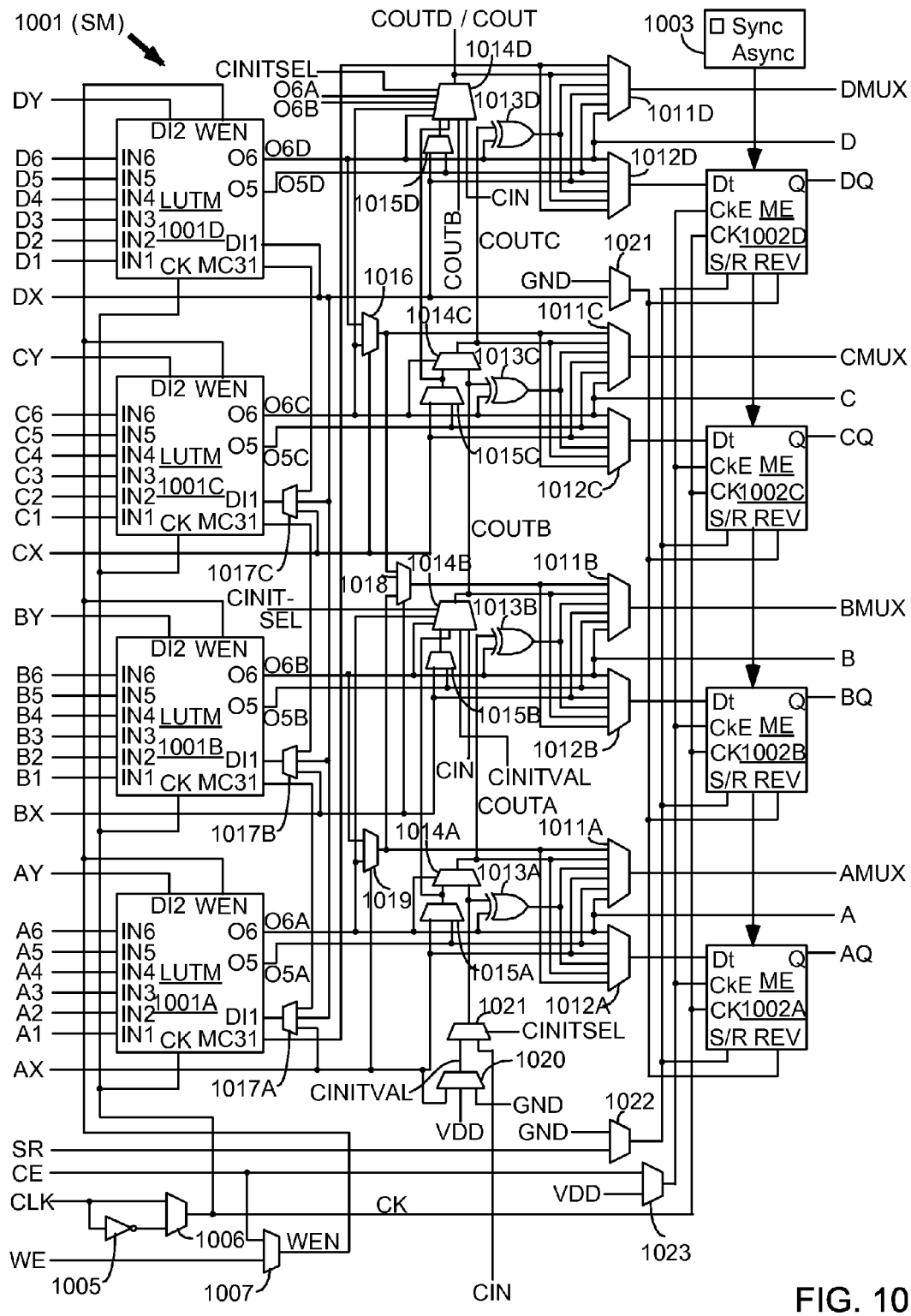
FIG. 10 is block diagram of a configurable logic element of the device of FIG. 9 according to an embodiment.

Turning now to FIG. 10, a block diagram of a configurable logic element according to an embodiment is shown. In particular, FIG. 10 illustrates in simplified form a configurable logic element of a configuration logic block 902 of FIG. 9. In the embodiment of FIG. 10, slice M 1001 includes four lookup tables (LUTMs) 1001A-1001D, each driven by six LUT data input terminals A1-A6, B1-B6, C1-C6, and D1-D6 and each providing two LUT output signals O5 and O6. The O6 output terminals from LUTs 1001A-1001D drive slice output terminals A-D, respectively. The LUT data input signals are supplied by the FPGA interconnect structure via input multiplexers, which may be implemented by programmable interconnect element 1011, and the LUT output signals are also supplied to the interconnect structure. Slice M also includes: output select multiplexers 1011A-1011D driving output terminals AMUX-DMUX; multiplexers 1012A-1012D driving the data input terminals of memory elements 1002A-1002D; combinational multiplexers 1016, 1018, and 1019; bounce multiplexer circuits 1022-1023; a circuit represented by inverter 1005 and multiplexer 1006 (which together provide an optional inversion on the input clock path); and carry logic having multiplexers 1014A-1014D, 1015A-1015D, 1020-1021 and exclusive OR gates 1013A-1013D. All of these elements are coupled together as shown in FIG. 10. Where select inputs are not shown for the multiplexers illustrated in FIG. 10, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 10 for clarity, as well as from other selected figures herein.

In the pictured embodiment, each memory element 1002A-1002D may be programmed to function as a synchronous or asynchronous flip-flop or latch. The selection between synchronous and asynchronous functionality is made for all four memory elements in a slice by programming Sync/Asynch selection circuit 1003. When a memory element is programmed so that the S/R (set/reset) input signal provides a set function, the REV input terminal provides the reset function. When the memory element is programmed so that the S/R input signal provides a reset function, the REV input terminal provides the set function. Memory elements 1002A-1002D are clocked by a clock signal CK, which may be provided by a global clock network or by the interconnect structure, for example. Such programmable memory elements are well known in the art of FPGA design. Each memory element 1002A-1002D provides a registered output signal AQ-DQ to the interconnect structure. Because each LUT 1001A-1001D provides two output signals, O5 and O6, the LUT may be configured to function as two 5-input LUTs with five shared input signals (IN1-IN5), or as one 6-input LUT having input signals IN1-IN6.

In the embodiment of FIG. 10, each LUTM 1001A-1001D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 1017A-1017C for LUTs 1001A-1001C), or to the two 32-bit RAMs via input terminals DI1 and DI2. RAM write operations in the LUT RAMs are controlled by clock signal CK from multiplexer 1006 and by write enable signal WEN from multiplexer 1007, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 1001A may also be provided to the general interconnect structure for shift register chaining, via output select multiplexer 1011D and CLE output terminal DMUX. Accordingly, the circuits and methods set forth above may be implemented in a device such as the devices of FIGS. 9 and 10, or any other suitable device.

Turning now to FIG. 11, a block diagram of an integrated circuit having a DAC circuit is shown. According to the embodiment of FIG. 11, a circuit board 1102, such as a printed circuit board, is configured to receive a multi-die integrated circuit 1104. The multi-die integrated circuit 1104 comprises a substrate 1106 coupled to receive an interposer circuit 1108. The interposer 1108 enables coupling multiple integrated circuit chips or die, such as FPGA chips 1110 and a data converter chip 1112 having ADC and DAC circuits, to the substrate 1106.

Figure 12:
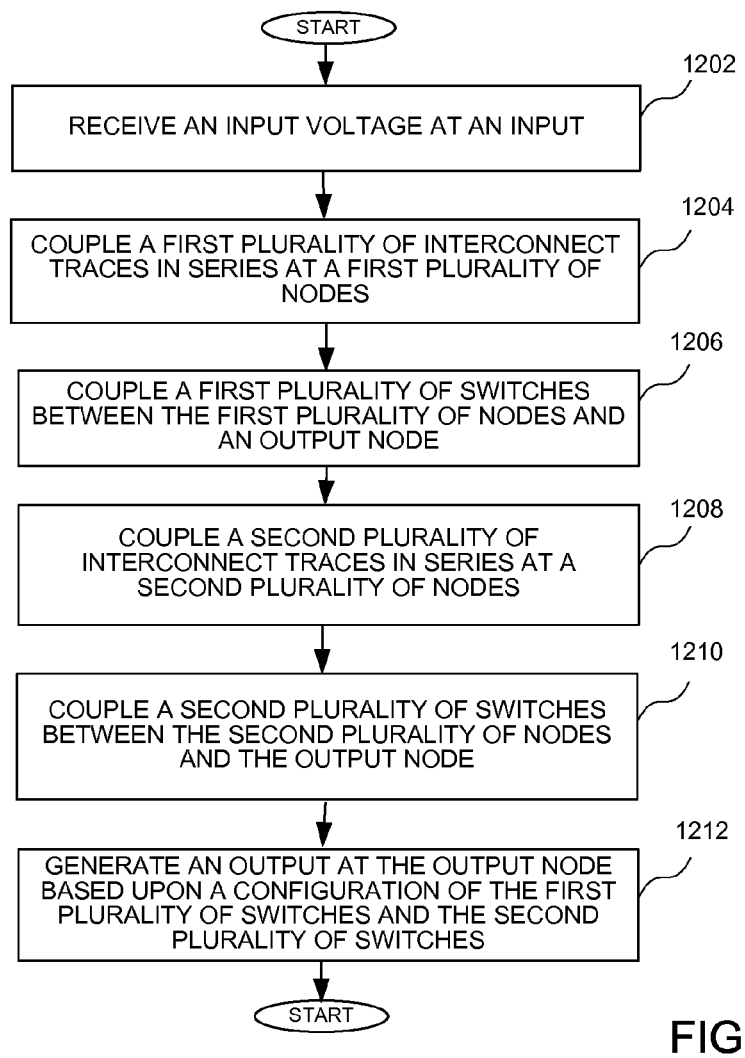
FIG. 12 is a flow chart showing a method of implementing a resistor network in an integrated circuit having a circuit which enables the discharge of electric charge.

Solder balls 1114 enabling enable coupling signals from the various chips to the circuit board 1102 by way of various interconnects 1116, such as through silicon vias (TSVs). Interconnects 1118 also enable the routing of signals between the various chips of the multi-die integrated circuit. The interposer circuit 1108 may be a silicon substrate with various metal layers comprising interconnect elements enabling the routing of signals between the FPGA chips and the data converter chip or between one of the chips and the substrate 1106. However, the interposer circuit may be any material having conductive elements which enable routing signals as shown. While all of the circuits of the FPGA chips 1110 and the data converter chip 1112 may be implemented on a single die, the embodiment of FIG. 17 enables more efficiently implementing the various circuits of FPGA chips 1110 and the data converter chip 1112. For example, some circuits may be more efficiently implemented in an integrated circuit chip manufactured according to one process, such as a process forming transistors of a certain dimension, while other circuits may be implemented more efficiently in an integrated circuit chip manufactured according to another process Turning now to FIG. 12, a flow chart shows a method of implementing a resistor network in an integrated circuit. An input voltage is received at an input at a step 1202. A first plurality of interconnect traces are coupled in series at a first plurality of nodes at a step 1204. A first plurality of switches is coupled between the first plurality of nodes and an output node at a step 1206. A second plurality of interconnect traces is coupled in series at a second plurality of nodes at a step 1208. A second plurality of switches is coupled between the plurality of nodes and the output node at a step 1210. An output is then generated at the output node based upon a configuration of the first plurality of switches and the second plurality of switches at a step 1212. The method of FIG. 12 can be implemented using any of the circuits as described above, or other suitable circuits. Although certain elements of the method are shown in FIG. 12, additional methods or elements of methods may be implemented according to the description of the circuits of FIGS. 1-11.

It can therefore be appreciated that new resistor networks in an integrated circuit and methods of implementing a resistor network in an integrated circuit have been described. It will be appreciated by those skilled in the art that numerous alternatives and equivalents will be seen to exist that incorporate the disclosed invention. As a result, the invention is not to be limited by the foregoing embodiments, but only by the following claims.

What is claimed is:

1. A resistor network implemented in an integrated circuit, the resistor network comprising:
    a plurality of metal layers;
    a first plurality of interconnect traces coupled in series at a first plurality of nodes, wherein each interconnect trace of the first plurality of interconnect traces is formed in a metal layer of the plurality of metal layers and has a selected resistance based on a size of the interconnect trace;
    a first plurality of switches coupled between the first plurality of nodes and an output node;
    a second plurality of interconnect traces coupled in series at a second plurality of nodes, wherein each interconnect trace of second first plurality of interconnect traces is formed in a metal layer of the plurality of metal layers and has a selected resistance based upon a size of the interconnect trace; and
    a second plurality of switches coupled between the second plurality of nodes and the output node;
    wherein a voltage at the output node is generated in response to a resistance of the resistor network based upon a configuration of the first plurality of switches and the second plurality of switches.

2. The resistor network of claim 1, wherein the first plurality of interconnect traces and the second plurality of interconnect traces are coupled to a reference voltage.

3. The resistor network of claim 2, wherein the resistor network comprises a digital-to-analog converter.

4. The resistor network of claim 3, wherein the first plurality of switches and the second plurality of switches are controlled by a digital input value.

5. The resistor network of claim 4, wherein the voltage generated at the output comprises a voltage between a first voltage and a second voltage based upon the digital input value.

6. The resistor network of claim 1, wherein each of the interconnect traces has approximately the same dimensions.

7. The resistor network of claim 1, wherein the interconnect traces have different dimensions to provide different resistances.

8. A resistor network implemented in an integrated circuit, the resistor network comprising:
a plurality of metal layers;
a first plurality of interconnect traces coupled in series at a first plurality of nodes, wherein each interconnect trace of the first plurality of interconnect traces is formed in a metal layer of the plurality of metal layers and has a selected resistance based upon a size of the interconnect trace;
a first resistor coupled to the first plurality of interconnect traces;
a first plurality of switches coupled between the first plurality of nodes and an output node;
a second plurality of interconnect traces coupled in series at a second plurality of nodes, wherein each interconnect trace of the second plurality of interconnect traces is formed in a metal layer of the plurality of metal layers and has a selected resistance based upon a size of the interconnect trace; and
a second plurality of switches coupled between the second plurality of nodes and the output node;
wherein a voltage at the output node is generated in response to a resistance of the resistor network based upon a configuration of the first plurality of switches and the second plurality of switches.

9. The resistor network of claim 8, further comprising a second resistor coupled to the second plurality of interconnect traces.

10. The resistor network of claim 8, wherein the first plurality of interconnect traces and the second plurality of interconnect traces are coupled to a reference voltage.

11. The resistor network of claim 10, wherein:
the resistor network comprises a digital-to-analog converter; and
the first plurality of switches and the second plurality of switches are controlled by a digital input value.

12. The resistor network of claim 11, wherein the voltage generated at the output comprises a voltage between a first voltage and a second voltage based upon the digital input value.

13. The resistor network of claim 8, wherein each of the interconnect traces has approximately the same dimensions.

14. The resistor network of claim 8, wherein the interconnect traces have different dimensions to provide different resistances.

15. A method of implementing a resistor network, the method comprising:
providing a plurality of metal layers;
coupling a first plurality of interconnect traces in series at a first plurality of nodes, wherein each interconnect trace of the first plurality of interconnect traces is formed in a metal layer of the plurality of metal layers and has a selected resistance based upon a size of the interconnect trace;
coupling a first plurality of switches between the first plurality of nodes and an output node;
coupling a second plurality of interconnect traces in series at a second plurality of nodes, wherein each interconnect trace of the second plurality of interconnect traces is formed in a metal layer of the plurality of metal layers and has a selected resistance based upon a size of the interconnect trace;
coupling a second plurality of switches between the second plurality of nodes and the output node; and
generating a voltage at the output node in response to a resistance of the resistor network based upon a configuration of the first plurality of switches and the second plurality of switches.

16. The method of claim 15, further comprising coupling a reference voltage to the first plurality of interconnect traces and the second plurality of interconnect traces.

17. The method of claim 15, wherein further comprising controlling the first plurality of switches and the second plurality of switches by a digital input value.

18. The method of claim 17, wherein generating the voltage at the output node comprises generating a voltage, between a first voltage and a second voltage, based upon the digital input.

19. The method of claim 15, further comprising coupling a resistor in series with the first plurality of interconnect traces.

20. The method of claim 15, wherein coupling a first plurality of interconnect traces at a first plurality of nodes comprises coupling interconnect traces having different dimensions.

* * * * *